(12) United States Patent
Braeuer et al.

(10) Patent No.: US 8,299,630 B2
(45) Date of Patent: Oct. 30, 2012

(54) MICROSTRUCTURE WITH REACTIVE BONDING

(75) Inventors: Joerg Braeuer, Chemnitz (DE); Thomas Gessner, Chemnitz (DE); Lutz Hofmann, Chemnitz (DE); Joerg Froemel, Chemnitz (DE); Maik Wiemer, Limbach-Oberfrohna (DE); Holger Letsch, Muehlhausen (DE); Mario Baum, Scharfenstein (DE)

(73) Assignees: Fraunhofer-Gesellschaft zur Foerderung der Angewandten Forschung E.V., Munich (DE); Technische Universitaet Chemnitz, Chemnitz (DE)

( * ) Notice: Subject to any disclaimer, the term of this patent is extended or adjusted under 35 U.S.C. 154(b) by 0 days.

(21) Appl. No.: 13/146,759

(22) PCT Filed: Jan. 26, 2010

(86) PCT No.: PCT/DE2010/000085
§ 371 (c)(1),
(2), (4) Date: Jul. 28, 2011

(87) PCT Pub. No.: WO2010/085942
PCT Pub. Date: Aug. 5, 2010

(65) Prior Publication Data
US 2011/0284975 A1 Nov. 24, 2011

(30) Foreign Application Priority Data

Jan. 29, 2009 (DE) .......................... 10 2009 006 822

(51) Int. Cl.
*H01L 23/48* (2006.01)
*H01L 29/40* (2006.01)
*H01L 21/44* (2006.01)
*H01L 21/48* (2006.01)

(52) U.S. Cl. . 257/783; 257/625; 257/777; 257/E21.499; 257/E21.519; 438/108; 438/116; 438/455; 977/835

(58) Field of Classification Search .................. 257/618, 257/625, 777, 779, 782, 783, E21.499, E21.519; 438/118, 108, 455, 694; 977/835
See application file for complete search history.

(56) References Cited

U.S. PATENT DOCUMENTS 6,736,942 B2 5/2004 Weihs et al.
(Continued)

FOREIGN PATENT DOCUMENTS

DE 10 2004 004 539 A1 1/2005
(Continued)

OTHER PUBLICATIONS

International Search Report of PCT/DE2010/000085, dated Jan. 28, 2011.

(Continued)

*Primary Examiner* — Shouxiang Hu
(74) *Attorney, Agent, or Firm* — Laurence A. Greenberg; Werner H. Stemer; Ralph E. Locher

(57) ABSTRACT

A microstructure has at least one bonding substrate and a reactive multilayer system. The reactive multilayer system has at least one surface layer of the bonding substrate with vertically oriented nanostructures spaced apart from one another. Regions between the nanostructures are filled with at least one material constituting a reaction partner with respect to the material of the nanostructures. A method for producing at least one bonding substrate and a reactive multilayer system, includes, for forming the reactive multilayer system, at least one surface layer of the bonding substrate is patterned or deposited in patterned fashion with the formation of vertically oriented nanostructures spaced apart from one another, and regions between the nanostructures are filled with at least one material constituting a reaction partner with respect to the material of the nanostructures. A microsystem is formed from two bonding substrates and a construction lying between the bonding substrates, the construction having a reacted reactive layer system. The microsystem is a sensor coated with biomaterial and/or has elements composed of polymeric material and/or at least one magnetic and/or piezoelectric and/or piezoresistive component.

26 Claims, 7 Drawing Sheets

U.S. PATENT DOCUMENTS

| | | |
|---|---|---|
| 7,176,106 B2 | 2/2007 | Snyder et al. |
| 7,202,553 B2 | 4/2007 | Snyder et al. |
| 7,278,354 B1 | 10/2007 | Langan et al. |
| 7,361,412 B2 | 4/2008 | Wang et al. |
| 7,365,822 B2 | 4/2008 | Lee et al. |
| 7,713,849 B2 * | 5/2010 | Habib et al. ............ 438/479 |
| 7,879,721 B2 * | 2/2011 | Gangopadhyay et al. .... 438/663 |
| 2004/0251524 A1 | 12/2004 | Snyder et al. |
| 2007/0099335 A1 | 5/2007 | Gangopadhyay et al. |
| 2009/0035513 A1 * | 2/2009 | Bortner et al. ............ 428/131 |
| 2009/0235915 A1 | 9/2009 | Doumanidis et al. |
| 2011/0089462 A1 * | 4/2011 | Van Heerden et al. ......... 257/99 |

FOREIGN PATENT DOCUMENTS

| | | |
|---|---|---|
| WO | 2005/005092 A2 | 1/2005 |
| WO | 2005/011908 A1 | 2/2005 |
| WO | 2008/021073 A2 | 2/2008 |

OTHER PUBLICATIONS

Yu-Ching Lin, et al., "Nanofabrication of reactive structure for low temperature bonding", Proceedings of the 2009 IEEE 3rd International Conference on Nano/Molecular Medicine and Engineering, Oct. 18-21, 2009, Taiwan, Taiwan, pp. 313-317.

X. Qiu, et al., "Bonding silicon wafers with reactive multilayer foils", Sensors and Actuators A 141, 2008, pp. 476-481.

J. Wang, et al., "Room-temperature soldering with nanostructured foils", Nov. 10, 2003, vol. 83, No. 19, Applied Physics Letters, pp. 3987-3989.

Andreas Richter, et al., "Review on Hydrogel-based pH Sensors and Microsensors", Jan. 25, 2008, Sensors, pp. 561-581.

T. Namazu, et al., "Self-propagating explosive reactions in nanostructured Al/Ni multilayer films as a localized heat process technique for MEMS", Jan. 2006, MEMS, Istanbul, Turkey, pp. 286-289.

J.S. Subramanian, et al., "Room temperature soldering of microelectronic components for enhanced thermal performance", 2005, 6th Int. Conf. on Thermal, Mechanical and Multiphysics Simulation and Experiments in Micro-Electronics and Micro-Systems, EuroSimE, pp. 681-686.

* cited by examiner

MICROSTRUCTURE WITH REACTIVE BONDING

BACKGROUND OF THE INVENTION

Field of the Invention

Present-day construction and connection technology is aimed at components and microsystems becoming ever smaller and more complex. In this case, the aim is to minimize the influence of heat during contact-connection, in order not to damage sensitive elements. Although established joining methods leading to hermetically sealed connections in microsystems technology or wafer bonding methods such as anodic bonding, low-temperature silicon direct bonding, seal glass bonding or eutectic bonding effect connection reliably, temperatures of in some instances above 400° C. prevail here over a relatively long period of time. These high temperatures acting for a relatively long time can damage sensitive components or materials. Furthermore, on account of the differences in the coefficients of thermal expansion, it is scarcely possible to connect different substrates, such as silicon, metals, ceramics or polymers, impermeably over a large area.

On the other hand, it is becoming increasingly more difficult to connect complex products and the housings thereof in an automated manner, reliably and impermeably. Alongside temperature-sensitive sensors, shaded joints repeatedly arise, which cannot readily be reached with welding and soldering tools.

For this reason, in recent years intensified research has been conducted on technologies which allow a selective energy input only at the required joint on areas having a size of square micrometers.

Furthermore, in recent years methods have been developed which utilize a local, internal energy source that enables the energy to act directly on the connection. By way of example, reactive powders are used which produce a self-propagating reaction, which, however, is difficult to monitor and control. Alternatively, the prior art discloses reactive multilayer systems consisting of a multiplicity of thin, alternating layers, which, by virtue of their reaction properties, allow control of the thermal energy that is very high but liberated for a short time.

Multilayer systems are known in many different aspects in semiconductor and microsystems technology. By way of example, such layer stacks are utilized for the targeted setting of reflectivities in optical elements or else for influencing layer stresses and stress. Multilayers composed of $SiO_2$/polysilicon are used for infrared components and multilayers composed of Mo/Si, $Ni/B_4C$, $Mo/B_4C$, etc. are used for extreme ultraviolet (EUV) and x-ray optics.

Currently available reactive multilayer films consist for the most part of a layer stack comprising an aluminum layer, which are offered in a manner alternating with other layers (usually nickel, monel (70% Ni, 30% Cu), titanium or zirconium) as self-supporting films. Alternating layer constructions composed of silicon, paired with rhodium, nickel or zirconium, are alternatively used. The self-supporting multilayer films used have total thicknesses of 30 µm to 1 cm with individual layer thicknesses in the range of 10 nm to 100 nm. According to providers, a wide variety of materials can be connected to one another with the aid of the films.

The films can be patterned, e.g. by means of stamping. Integration of these films in a microelectronic or micromechanical manufacturing process appears to be difficult, however, since the brittle films require very careful handling, and are difficult to position and difficult to ignite.

If the known reactive multilayer films are employed in a joining method, on account of a thermally induced mixing of the alternating layers of the multilayer system, energy is released as a result of a reaction that proceeds exothermically. After a single initiation of the reaction, the liberated heat of reaction ideally leads to a continuous connection of the joining partners.

The article by Qiu and Wang "Bonding silicon wafers with reactive multilayer foils" in Sensors and Actuators A141 (2008), pages 476 to 481, describes a bonding method in which two silicon wafers, which are coated with a gold and chromium coating and between which a layer stack composed of two solder or connection layers and a reactive film is arranged, are connected to one another under the action of pressure. The reactive film used in this case is a reactive multilayer film which is composed of nickel-aluminum layers and which projects from the layer stack at one side and is ignited by an electrical spark at said side.

The joining method described by Qiu and Wang has the disadvantage that the reactive multilayer film used requires very careful handling. This is the case particularly when only selected and/or particularly small regions of the surfaces of substrates are intended to be connected to one another, since the known multilayer films can only be patterned mechanically, as a result of which small dimensions or the assignment thereof to the regions to be bonded cannot be realized with the necessary accuracy. In addition, when reactive multilayer films are used in joining processes, at least part of the film has to be externally accessible in order to be able to ignite the film. As a result, undesired residues or structural alterations can arise at the side of the substrates to be connected. Furthermore, as a result of the reactive multilayer film being ignited laterally, under certain circumstances, only a limited part of the multilayer film can be converted upon ignition, such that an incomplete joining result is obtained.

In accordance with the document WO 2008/021073 A2, reactive nanolayers can also be deposited areally one above another on a substrate. For this purpose, the document furthermore proposes providing a non-reactive intermediate layer or a valve element between the respective reactive layers, as a result of which a direct contact between the reactive layers can be prevented or controlled in a defined manner.

Furthermore, the document WO 2008/021073 A2 discloses a reactive structure in which, firstly, pores are formed in a non-reactive aluminum oxide layer deposited on a silicon substrate. In this case, the individual pores are delimited from one another by upright walls composed of aluminum oxide. Afterward, aluminum is deposited firstly into the free pores by means of electron beam deposition. This is followed by electron beam deposition of nickel into the free pores. In this way, bimetallic Al/Ni nanorods separated from one another by the pore walls arise in each of the pores, which nanorods are exothermically reactive and can thus form nanoheaters. For this purpose, it is necessary for the non-reactive aluminum oxide situated between the nanorods to be removed by etching. As a result, a structure arises which has a multiplicity of vertical Al/Ni nanorods separated from one another, wherein each of the nanorods can inherently react.

However, the document does not explain how contact should be made with such structures. In addition, it is questionable how, in such a structure, an areally self-propagating reaction required for joining processes is supposed to be effected where the reactive nanorods are indeed separated from one another.

BRIEF SUMMARY OF THE INVENTION

Therefore, the object of the present invention is to provide a microstructure and a method for producing a microstructure, a device for bonding a microstructure to a further structure, and a microsystem of the generic type mentioned above which make it possible to provide a high-quality joining result by means of a joining method which can be handled in a simple manner, which can also be used for joining temperature-sensitive substrates. Furthermore, according to the invention, even small and hard-to-reach surfaces of substrates are intended to be able to be connected to one another.

The object is achieved firstly by means of a microstructure comprising at least one bonding substrate and a reactive multilayer system, wherein the reactive multilayer system has at least one surface layer of the bonding substrate with vertically oriented nanostructures spaced apart from one another, and regions situated between the nanostructures and filled with at least one material constituting a reaction partner with respect to the material of the nanostructures.

This microstructure has the advantage that it can be produced in a conventional microelectronic or micromechanical process sequence. Moreover, the microstructure according to the invention, on the bonding substrate, gives rise to a structure construction in which the reactive layers or structures are not formed horizontally, as known from the prior art, but rather vertically, directly alongside one another on the bonding substrate. This has the advantage that a multiplicity of nanostructures with—situated therebetween—regions filled with the material constituting the reaction partner with respect to the material of the nanostructures can be provided, wherein the structure height of the nanostructures and hence the overall construction can be kept relatively small.

The nanostructures can be produced in a simple manner by means of conventional layer deposition and subsequent patterning or directly by patterned deposition, for example by means of a mask technology. This gives rise to a multiplicity of nanostructures spaced apart from one another in a simple technology sequence, wherein the nanostructures can be formed with high accuracy.

In contrast to the high expenditure of work associated with the production of a multiplicity of multiply alternating nanolayers deposited horizontally on a bonding substrate or with the production—described in the document WO 2008/021073 A2—of vertical reactive nanorods spaced apart from one another horizontally, therefore, in the case of the present microstructure variant according to the invention, a reactive multilayer system having a large number of nanostructures and—situated therebetween—regions filled with the material constituting the reaction partner with respect to the material of the nanostructures can be realized by just a few process steps, such that the production time and the production costs for the formation of the reactive multilayer system can be significantly reduced.

In this case, according to the invention, in contrast to the document WO 2008/021073 A2, it suffices to form the nanostructures from a single material and to deposit a single material into the interspace between the nanostructures, which material can then react in each case with the material of the nanostructures. This last is not possible in the document WO 2008/021073 A2, since either aluminum oxide, i.e. a non-reactive material, or—after the aluminum oxide has been etched away—air is situated between the reactive nanorods. Accordingly, in the document WO 2008/021073 A2, it is necessary to form the nanorods themselves from at least two materials which react with one another, which necessitates at least two layer depositions in the pores.

Moreover, in the present invention, the nanostructures and also the regions situated therebetween can be formed with high accuracy, corresponding smallness and high structure density, wherein the material of the nanostructures directly adjoins the material situated therebetween, such that it is possible to obtain a particularly advantageous reaction between the nanostructures and the material situated therebetween.

In one particularly expedient example of the present invention, the vertical nanostructures are embodied in web-like fashion. Such web-like nanostructures can be produced with high effectiveness by means of known lithography methods in conjunction with wet or dry etching steps. In this case, the webs act like nanolayers which are oriented upright on the substrate, are separated from one another horizontally by the material situated therebetween and can react particularly suitably with the material situated therebetween.

It has furthermore proved to be beneficial if the vertical nanostructures are embodied in acicular fashion, for example in the form of a "nanolawn". The acicular nanostructures can be formed with particular fineness, as a result of which the melting point of the materials used can be lowered, thus resulting in a particularly good reaction between the material of the acicular nanostructures and the material situated therebetween. The individual structures of the "nanolawn" can be geometrically defined or ordered and also stochastically distributed or formed and/or distributed in disordered fashion. Thus, the individual structures of the "nanolawn" can have identical and also different distances, heights and/or thicknesses.

Preferably, the vertical nanostructures have a structure width of approximately 10 nm to approximately 300 nm. On account of the small structure width, a multiplicity of vertical nanostructures can be produced alongside one another, which can react particularly readily to form a rapidly propagating reaction front.

In one preferred exemplary embodiment of the present invention, the vertical nanostructures have an aspect ratio of structure width to structure depth of approximately 1:8 to approximately 1:12. The height of the structures is thus significantly greater than the width thereof, such that the vertical nanostructures, as seen from the side, act like a multiplicity of thin vertical layers, the interspaces of which are filled with the material constituting a reaction partner with respect to the material of the nanostructures, such that a particularly straightforward and complete reaction between the material of the nanostructures and the material lying therebetween can be effected.

It is particularly useful if at least one insulator layer is provided below the surface layer, that is to say below the nanostructure. In this case, the insulator layer can serve for electrically and/or thermally insulating the vertical reactive layer stack situated thereabove from the rest of the substrate.

Preferably, in one variant of the microstructure according to the invention, the bonding substrate is an SOI (silicon on insulator) substrate or is formed from an SOI substrate and/or is equipped with a (nano)porous layer, such as an aerogel, having a particularly high thermal resistance. Thus, the upper silicon layer situated on an SOI substrate can be suitably patterned to form the vertical nanostructures, wherein the underlying thermal insulation layer formed by the oxide layer or the highly porous or nanoporous layer brings about particularly good thermal and/or electrical insulation of the vertical reactive layer stack from the rest of the substrate.

In one expedient development of the present invention, an electrical and/or thermal contact layer or structure is provided on the material constituting a reaction partner with respect to the material of the nanostructures. The contact layer or structure can also be provided in a locally delimited manner on the material constituting a reaction partner with respect to the material of the nanostructures. In this case, the contact layer or structure can be used as an initiator or igniter layer or structure. By way of example, a heated tungsten interconnect is appropriate for this purpose.

In accordance with one particularly suitable embodiment of the present invention, a further structure is applied to the contact layer or structure, said further structure having a bonding substrate and a solder or connection layer deposited on the bonding substrate or on at least one adhesion and/or wetting layer provided on the bonding substrate, wherein the solder or connection layer of the further structure bears on the contact layer or structure of the microstructure. Consequently, a structure provided with a solder can advantageously be bonded to the microstructure with initiation of a reaction between the material of the nanostructures and the material situated therebetween.

In accordance with a further, likewise preferred embodiment variant of the present invention, a further structure is applied to the contact layer or structure, said further structure having a bonding substrate having at least one surface layer with vertically oriented nanostructures spaced apart from one another, wherein regions between the nanostructures are filled with at least one material constituting a reaction partner with respect to the material of the nanostructures. In the case of such a structure sequence, it is possible, if appropriate, to dispense with providing a solder or connection layer between the substrates to be bonded, it being sufficient to initiate a reaction between the material of the vertically oriented nanostructures and the material situated therebetween.

In one advantageous embodiment of the present invention, at least one of the nanolayers or nanostructures has, or the filled regions have, a material having a melting point of ≦500° C. Materials such as zinc, tin, indium or lithium are appropriate for this. Owing to the relatively low melting point of at least one of the reactive layers or structures, it is possible to perform an initiation of a reaction between the nanolayers or between the nanostructures and the material constituting a reaction partner with respect to the material of the nanostructures at relatively low temperatures, as a result of which the thermal loading when joining the microstructure to another structure can be kept low.

In one practicable example of the present invention, at least one adhesion and/or wetting layer is deposited on the material constituting a reaction partner with respect to the material of the nanostructures. The adhesion and/or wetting layer makes it possible to provide good adhesion properties and/or wetting properties for a solder or connection layer applied on the layer sequence or a further structure applied thereon, such that the microstructure according to the invention can be produced straightforwardly and has a stability required for the subsequent bonding.

Particularly straightforward and effective ignition of the layer sequence of the microstructure can be achieved if the material constituting a reaction partner with respect to the material of the nanostructures is contact-connected by at least one electrical contact structure, wherein the at least one contact structure is connected to an electrically conductive channel leading at least through the bonding substrate of the microstructure and/or the bonding substrate of a further structure applied to the microstructure. In this case, the contact can be provided as one or a plurality of individual contact(s) or as planar contact-connection or contact layer both from above and laterally at the microstructure. Consequently, the reactive arrangement can be electrically ignited in a targeted manner at the at least one electrical contact structure, wherein simple contact-connection is possible from outside by means of the electrically conductive channel provided.

Expediently, the at least one electrical contact structure and the electrically conductive channel are formed from copper. Copper has a very good electrical conductivity and is conventionally available and can readily be deposited and patterned using deposition technologies appertaining to microelectronics and/or micromechanics, such that good and permanently usable electrical contacts and electrically conductive channels can be formed by copper in a simple manner.

The object of the invention is furthermore achieved by means of a method for producing a microstructure comprising at least one bonding substrate and a reactive multilayer system, wherein, for forming the reactive multilayer system, at least one surface layer of the bonding substrate is patterned or deposited in patterned fashion with the formation of vertically oriented nanostructures spaced apart from one another, and regions between the nanostructures are filled with at least one material constituting a reaction partner with respect to the material of the nanostructures. In this case, the material constituting a reaction partner with respect to the material of the nanostructures can also cover the vertically oriented nanostructures.

Consequently, according to the invention, a reactive multilayer system oriented vertically on a substrate can be provided, the vertically oriented nanostructures of which can react with the material situated therebetween with the release of heat of reaction, in order to be able to join the substrate to another structure or another substrate. The structure produced by means of the method according to the invention can be produced with a multiplicity of nanostructures highly accurately and with high productivity, wherein the method according to the invention is fully compatible with conventional processes of microelectronics or micromechanics, such that it can easily be integrated into any manufacturing sequences appertaining to microelectronics or micromechanics.

In one advantageous example of the present invention, an SOI substrate or a prepatterned SOI substrate and/or a substrate with a nanoporous layer, which is embodied in a manner similar to an aerogel and has a particularly high thermal resistance, are/is used as bonding substrate. Such a substrate is suitable in particular for the method according to the invention since the material situated on the nanoporous layer or the oxide layer can be patterned in a simple manner to form the vertical nanostructures and the underlying insulator or oxide layer can advantageously be utilized as a thermal or electrical insulation layer for the vertical reactive structures produced thereabove.

It has proved to be particularly expedient if the surface layer is patterned by electron beam lithography or by nanoimprinting. Such patterning methods make it possible to produce particularly fine and highly accurate structures, as a result of which the nanostructures that can be produced thereby are particularly suitable for the production of reactive, vertically oriented multilayer systems.

It is advantageous, moreover, if at least one adhesion and/or wetting layer is deposited on the material constituting a reaction partner with respect to the material of the nanostructures. The adhesion and/or wetting layer serves for more suitable application of an initiator or ignition layer on the material constituting a reaction partner with respect to the material of the nanostructures or can itself be utilized as an initiator or ignition layer.

In accordance with one particularly advantageous development of the present invention, an electrical and/or thermal contact layer or structure is deposited on the material constituting a reaction partner with respect to the material of the nanostructures. The contact layer or structure can be electrically or thermally contact-connected, for example, in order to bring about triggering of a reaction between the material of the vertical nanostructures and the material situated therebetween.

It has proved to be particularly practical if the material of the microstructure constituting a reaction partner with respect to the material of the nanostructures is deposited electrolytically. During electrolytic deposition, the process parameters of layer production can be optimized such that the thermomechanical stresses between the vertical nanostructures and the material situated therebetween are minimized.

The so-called pulse plating method has emerged as a particularly appropriate method for depositing the material constituting a reaction partner with respect to the material of the nanostructures, in which pulse plating method, from a mixed electrolyte, by changing over the voltage potential, it is possible to introduce at least two different materials, each constituting a reaction partner with respect to the material of the nanostructures, between the vertically oriented nanostructures.

Furthermore, with the aid of control of the process temperature during the deposition of the material constituting a reaction partner with respect to the material of the nanostructures, it is possible to reduce diffusion processes during the deposition of the materials and thus the mixing zones that already arise.

In accordance with one development of the present invention, a further structure having a bonding substrate, a solder or connection layer deposited on the bonding substrate or deposited on an adhesion and/or wetting layer provided on the bonding substrate is applied by means of the solder or connection layer to the layer sequence of the microstructure. This makes it possible to connect the two bonding substrates advantageously to one another by initiation of a reaction of the layers or structures situated between the bonding substrates.

It is likewise expedient if a further structure, having a bonding substrate having at least one surface layer with vertically oriented nanostructures spaced apart from one another, wherein regions between the nanostructures are filled with at least one material constituting a reaction partner with respect to the material of the nanostructures, is applied to the contact layer or structure of the microstructure by means of the material constituting a reaction partner with respect to the material of the nanostructures. In this way, it is possible to obtain a particularly good joining result between the microstructure and the further structure, wherein the joining process does not necessarily require the provision of a solder or connection layer between the substrates to be bonded. In this case, the joining process can be effected in a simple manner by electrical or thermal contact-connection of the contact layer or structure.

It has proved to be particularly suitable if the bonding substrate of the microstructure and/or the bonding substrate of the further structure and/or a solder or connection layer of the microstructure and/or the solder or connection layer of the further structure are/is patterned by an etching method, a lift-off method, a resist mask method, a shadow mask method, a photoresist method, a sacrificial layer method and/or a lithography method, wherein the patterning is effected below an activation temperature of the nanostructures and of the material constituting a reaction partner with respect to the material of the nanostructures. The invention thereby provides a wide selection of patterning methods which can be used to produce a wide variety of embodiments of the microstructure or of the layer sequences or structures thereof, thus resulting in a high variability of producible microstructures which can be connected to a joining partner. Since the patterning is effected below an activation temperature of the nanostructures and of the material constituting a reaction partner with respect to the material of the nanostructures, premature initiation of a reaction between the reactive structures can be prevented, such that the microstructure has advantageous joining properties after patterning as well.

In accordance with one preferred embodiment of the present invention, in a manner adjoining at least one of the nanostructures and/or the material constituting a reaction partner with respect to the material of the nanostructures, at least one electrical contact or an electrical contact layer is formed and/or at least one electrically conductive channel for making contact with the at least one contact or the electrical contact layer is formed which is led at least through the bonding substrate of the microstructure and/or the bonding substrate of the further structure. By means of this procedure, an advantageous ignition of the nanostructures and of the material constituting a reaction partner with respect to the material of the nanostructures can be initiated via an electrically conductive channel that can be reached in a simple manner from outside. In this case, one or a plurality of electrical contacts can be provided at the nanostructures and/or the material constituting a reaction partner with respect to the material of the nanostructures, in order to form a wide reaction front at the reactive layers or structures, such that a continuous, self-propagating exothermic reaction can take place between the reactive structures, whereby a very good joining result can be obtained.

During bonding of the microstructure to a further structure, in accordance with one embodiment variant of the method according to the invention, it is particularly expedient if the microstructure and the further structure are aligned with one another and pressed onto one another under a vacuum with a pressure of approximately 500 kPa to approximately 1500 kPa, and a temperature in a range of approximately 20° C. to approximately 200° C. is set. As a result, it is possible to obtain high-quality joining results, without high temperatures having to be set during the joining process from outside.

The object is furthermore achieved by means of a device for bonding a microstructure, which has at least one bonding substrate and a reactive multilayer system, to a further structure, which has a bonding substrate, wherein the device has a bonding chamber, which can be opened and closed and evacuated and in which the microstructure and the further structure can be introduced and aligned with one another, and also an activation mechanism, which is coupled to the bonding chamber and by means of which the reactive multilayer system of the microstructure, said reactive multilayer system being formed from reactive nanostructures with—situated therebetween—a material constituting a reaction partner with respect to the material of the nanostructures, can be activated mechanically, electrically, electromagnetically, optically and/or thermally in such a way that a self-propagating, exothermic reaction takes place between the nanostructures and the material constituting a reaction partner with respect to the material of the nanostructures.

The device according to the invention provides a novel bonding apparatus in which the reactive multilayer system provided between the bonding substrates can be ignited in a particularly suitable manner by the activation mechanism coupled to the bonding chamber, wherein appropriate joining process parameters can additionally be set in the bonding chamber. Consequently, with the aid of the device according to the invention, it is possible to obtain high-quality joining results between different substrates, even when using temperature-sensitive components or materials, since the required quantity of heat can be accurately set and controlled by means of the generated quantity of heat of the exothermic reaction and the temperature to be set at the device.

By way of example, the activation mechanism used in the device according to the invention has a current pulse transmitter, an oscillation pulse transmitter, a laser pulse transmitter, a heat transmitter and/or a micro-igniter. The activation mechanisms proposed can be coupled to the bonding chamber of the device according to the invention or be integrated therein individually or in combination in a suitable manner, such that a reaction between the nanostructures and the material constituting a reaction partner with respect to the material of the nanostructures can be initiated directly at the bonding substrates and/or the reactive layer sequence or the reactive structures.

In accordance with one advantageous embodiment of the present invention, electrical contact-connections and/or contact pads are integrated in the bonding chamber, and they can be connected to at least one electrically conductive channel of the microstructure and/or the further structure. Particularly expedient initiation of a reaction between the structures of the reactive multilayer system can thus be obtained.

The object is additionally achieved by means of a microsystem formed from two bonding substrates and a construction lying between the bonding substrates, said construction having a reacted reactive layer system, wherein the reacted reactive layer system is a reacted structure sequence composed of at least one surface layer—provided on the bonding substrate—with vertically oriented nanostructures spaced apart from one another, and regions filled between the nanostructures with at least one material constituting a reaction partner with respect to the material of the nanostructures, wherein the microsystem is a sensor coated with biomaterial and/or has elements composed of polymeric material and/or at least one magnetic and/or piezoelectric and/or piezoresistive component.

Consequently, the invention provides a microsystem composed of interconnected bonding substrates, which microsystem would not be producible with suitable quality by means of conventional bonding technologies on account of its temperature sensitivity. Thus, the sensor that is formed from the microsystem according to the invention and is coated with biomaterial can be coated with proteins, DNA or antibodies, for example, which typically have a limiting temperature of 42° C. Furthermore, the elements composed of polymeric material that are formed from the microsystem proposed according to the invention can comprise, for example, microoptics, a microfluidic system or a polymer MEMS, the limiting temperature of which is usually approximately 100° C. Furthermore, the microsystem according to the invention can be embodied with magnetic components, such as magnetic field sensors (AMR or GMR), which have limiting temperatures of approximately 250° C.

Suitable embodiments of the present invention and the construction, function and advantages thereof are explained in greater detail below with reference to the figures of the drawing, wherein

DESCRIPTION OF THE INVENTION

Figure 1:
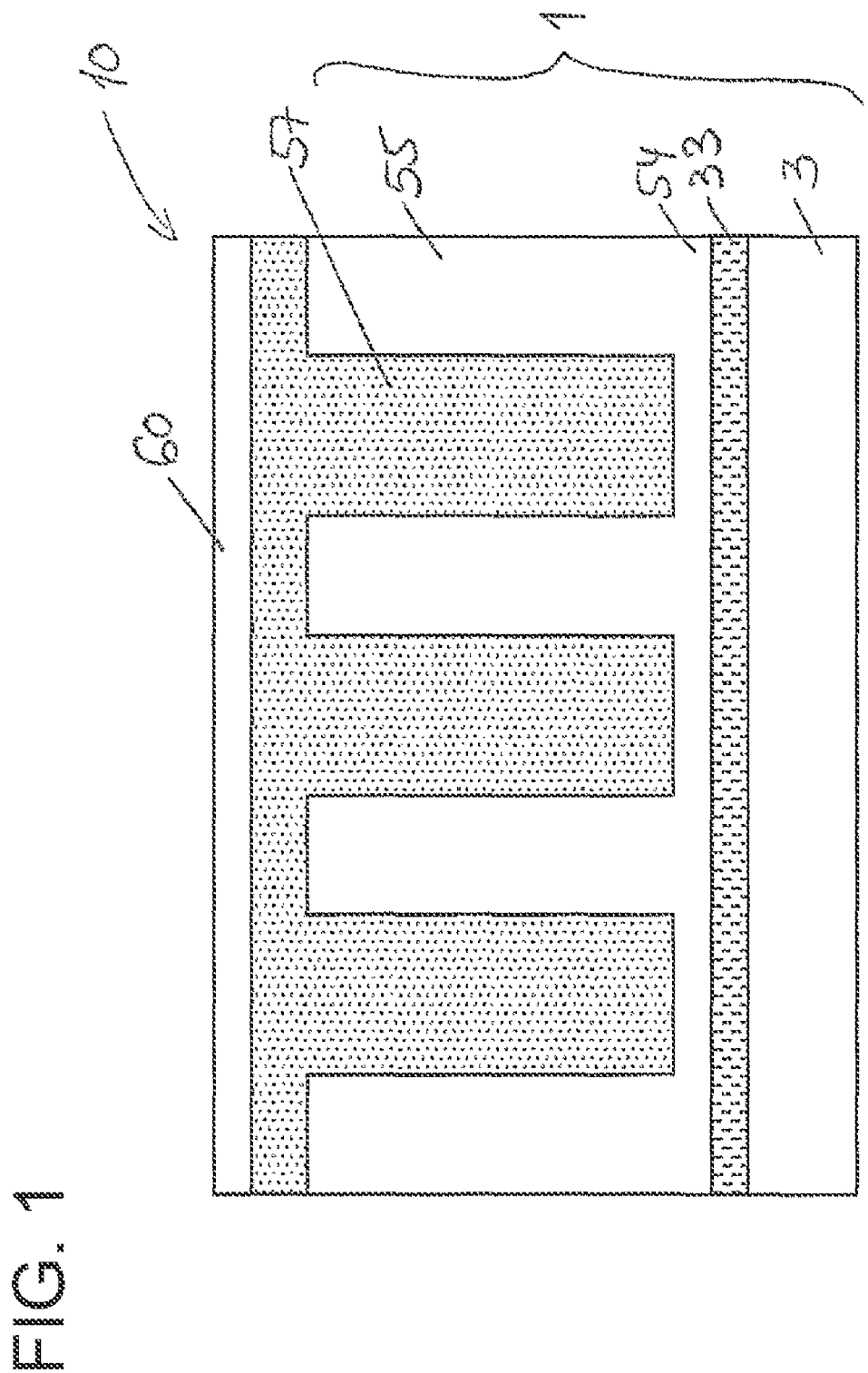
FIG. 1 schematically shows a microstructure in accordance with one embodiment of the present invention with vertical nanostructures embodied in web-like fashion in a sectional side view.

FIG. 1 schematically shows an embodiment of a microstructure 10 according to the invention in a sectional side view. The microstructure 10 has a bonding substrate 1, which in the example shown is an SOI substrate, consisting of a silicon bulk material 3, an insulator or oxide layer 33 and a patterned surface layer 54 situated thereon. The patterned surface layer has vertically oriented nanostructures 55 spaced apart from one another with, situated therebetween, regions filled with a material 57. These are explained in even greater detail below.

In other embodiment variants (not shown) of the present invention, the bonding substrate 1 can also be formed from a different material layer sequence, which contains e.g. other semiconductor or insulator materials, metal, glass or ceramic and the surface layer 54 of which is patterned or patternable and which preferably has an electrically and/or thermally insulating layer between the surface layer 54 and the rest of the substrate material. In a further embodiment of the present invention, the bonding substrate 1 can also be equipped with a (nano)porous layer, such as an aerogel, having a particularly high thermal resistance. In further embodiment variants of the present invention, which are shown in FIGS. 3 and 4, for example, preferably highly doped, conductive silicon or a metal such as palladium or platinum, for example, is used as material for the bonding substrate 1.

In the exemplary embodiment shown in FIG. 1, the bonding substrate 1 is a wafer, but, in other embodiment variants (not shown), it can also be some other substrate provided for a joining connection, such as a film. In particular, the bonding substrate 1 and/or elements thereof can be temperature-sensitive and/or have particularly small or hard-to-reach regions to be joined.

Furthermore, an adhesion layer can be deposited on the bonding substrate 1 or on the patterned surface layer 54 of the bonding substrate 1, a wetting layer and/or a solder and connection layer being deposited on said adhesion layer. The deposition of the adhesion layer and of the wetting layer can be effected, for example, by means of sputtering, vapor deposition or by electrolytic deposition. Possible adhesion layers can be formed from chromium, titanium or titanium nitride. Typically, adhesion and wetting layers of this type are only a few nanometers thin.

Through the bonding substrate 1 and the adhesion layer, an electrically conductive channel (not shown here), can be led as far as the nanostructures 55 and/or the material 57 situated therebetween, wherein the channel is formed from copper, for example. In such a case, the electrically conductive channel is connected to an electrical contact or an electrical contact layer 60 on the nanostructures 55 and/or the material 57. The electrical contact or the contact layer 60 can likewise be formed from copper. In other embodiments (not shown) of the present invention, it is also possible to effect a lateral contact-connection of the reactive structure formed from the nanostructures 55 and the material 57 situated therebetween, said reactive structure being described in greater detail below.

The solder or connection layer mentioned above can be a eutectic solder, a soft solder or a solid-liquid interdiffusion (SLID) solder. If a eutectic solder is used for the solder or connection layer, it can be formed from Au—Si having a melting point of 363° C. to 370° C., from Au/Ag/Cu/Al/—Sn having a melting point of 217° C. to 228° C., from Al—Ge having a melting point of 420° C., or from In—Sn having a melting point of 120° C. If a soft solder is used for the solder or connection layer, it can be Sn- or Ag-based, for example, and have a melting point of approximately 200° C. to 230° C. An appropriate solid-liquid interdiffusion (SLID) solder is, for example, In—Au/Al/Ag/Pt/Pd/Cu/Si/Ni or Sn—Pd/Cu/Al/Ag/Au. As material for the solder or connection layer it is also possible to use individual layers having a low melting point such as Sn or In or else Au as material melting at higher temperatures or eutectic partner and thermally curable materials such as adhesives, ceramics or polymers.

By way of example, lift-off, wet-etching or dry-etching methods can be used for patterning the adhesion layer, the wetting layer and/or the solder or connection layer, depending on the structure to be produced and the material to be patterned.

As already mentioned above, the surface layer 54 has has, in the exemplary embodiment shown in FIG. 1, web-like, vertically oriented nanostructures 55 spaced apart from one another. In other exemplary embodiments of the present invention, which are shown for example in FIG. 2, the nanostructures can also have a different structure form, structure height and/or structure width than the nanostructures 55 in FIG. 1. Thus, by way of example, the nanostructures 56 of the bonding substrate 1' shown in FIG. 2 are embodied in acicular fashion to form a lawn-like structure.

Figure 2:
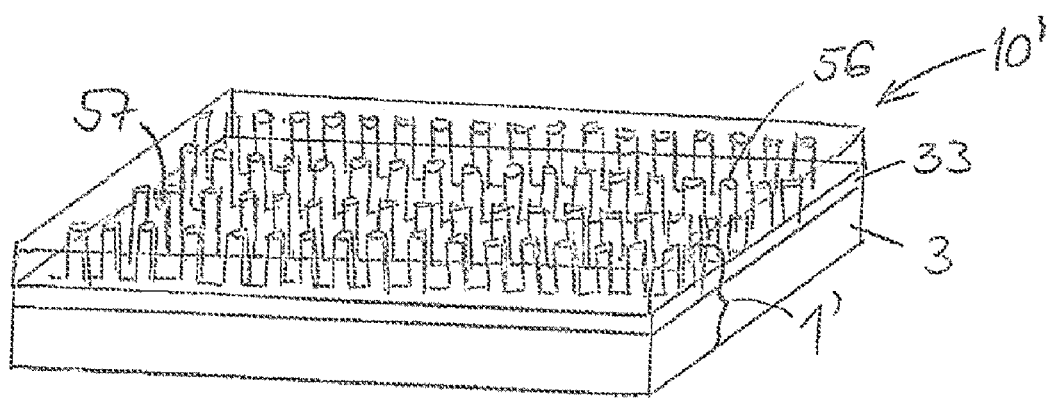
FIG. 2 schematically shows a further embodiment of a microstructure according to the invention with vertical nanostructures embodied in acicular fashion in a sectional side view.

The nanostructures 55, 56 from FIGS. 1 and 2 may have been patterned by means of electron beam lithography or by nanoimprinting, for example.

In the examples shown, the nanostructures 55, 56 have the structure width of approximately 10 nm to approximately 300 nm and an aspect ratio of structure width to structure depth of approximately 1:8 to approximately 1:12.

The regions lying between the nanostructures 55, 56 are filled with at least one material 57 constituting a reaction partner with respect to the material of the nanostructures 55, 56, wherein, in the example shown in FIG. 1, the material 57 covers the nanostructures 55. The materials of the nanostructures 55, 56 and of the material 57 are chosen such that they have a negative enthalpy of formation during mixing or alloy formation. The width of the nanostructures 55, 56 and of the material 57 situated therebetween is in each case chosen such that the energy liberated from the reaction between these materials suffices to achieve the temperature required for the bonding connection. What is important here is that the stoichiometric ratio of the material partners corresponds to that of the desired alloy. Appropriate material pairings for the material of the nanostructures 55, 56 and the material 57 situated therebetween include Ag—Pd, Ag—Cu, Cu—Ni, Pd—Co or Pd—Sn, Pd—Zn or Pd—In.

In the example shown, the material 57 is deposited electrochemically or electrolytically onto the bonding substrate 1. The so-called pulse plating method is particularly suitable for the deposition of the material 57. Electrolytic layer deposition is more sensitive in comparison with other layer deposition technologies and hence particularly well suited to the deposition of the material 57 on temperature-sensitive substrates, since the thermomechanical stresses in the structure to be produced can be optimized during the electrolytic deposition.

In other embodiment variants, it is also possible to use other deposition methods, for example PVD methods, such as magnetron sputtering or E-beam evaporation, or CVD vapor deposition processes, for depositing the material 57.

The process temperature is preferably controlled during the deposition of the material 57, as a result of which it is possible to reduce diffusion processes between the nanostructures 55, 56 and the material 57 and the production of mixing zones resulting therefrom.

The vertically oriented nanostructures 55, 56 spaced apart from one another and the material 57 situated between the nanostructures 55, 56 form a reactive multilayer system, wherein the nanostructures 55, 56 and the material 57 react with one another in a self-propagating, exothermic reaction after corresponding mechanical, electrical, electromagnetic, optical and/or thermal activation.

The nanostructures 55, 56 and the material 57 can be formed from Ag, Pd, Cu, Ni, Pt, Co, Au, Sn, Zn, Zr, In, Si or Li or from combinations or alloys of these materials. In the choice of materials for the nanostructures 55, 56 and the material 57, at least one of the materials should have a relatively low melting point. In this case, materials such as Sn, In or Li are primarily considered. Corresponding partners or combinations depend on the magnitude of the negative enthalpy of formation of the reaction and the electrochemical suitability for electrolytic deposition. In this case, it is possible to construct functioning systems with Au, Ag, Zn and Ni, for example.

A solder or connection layer or a layer stack composed of a solder or connection layer, a wetting layer and/or an adhesion layer can be provided on the material 57.

In the example in FIG. 1, a contact layer 60 is provided on the material 57, which contact layer can be electrically contact-connected and thereby serves as an initiator or ignition layer for the arrangement situated underneath, consisting of the material 57 and the nanostructures 55, 56. Instead of the contact layer 60 illustrated in FIG. 1, a contact structure or heating structure can also be provided, which makes electrical and/or thermal contact with the material 57 and/or at least one of the nanostructures 55, 56.

The contact layer 60 in FIG. 1 is provided areally on the material 57. In other embodiment variants (not shown) of the present invention, the contact layer 60 or a corresponding contact structure can also be arranged in a locally delimited manner, for example as one or a plurality of point contact(s) above and/or also laterally at the arrangement composed of the material 57 and the nanostructures 55.

Figure 5:
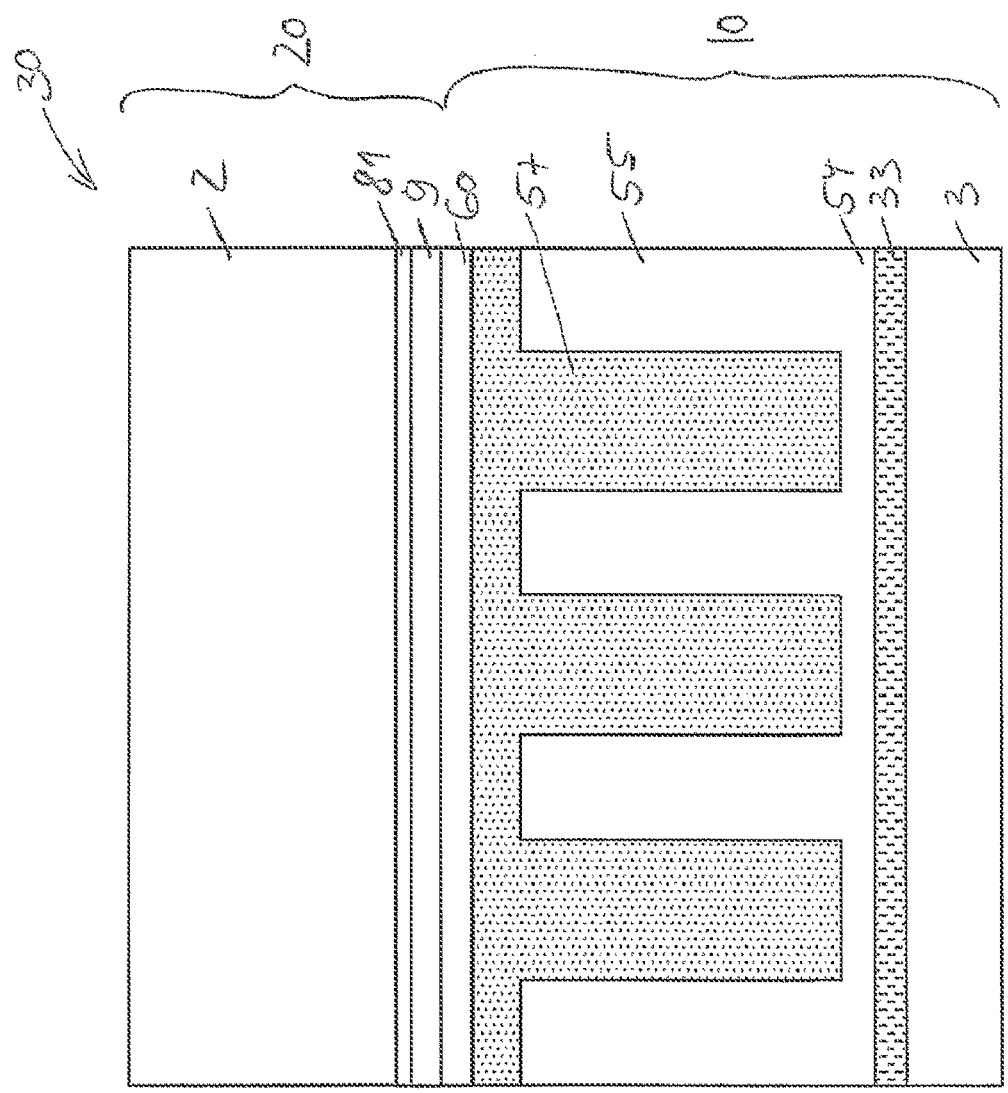
FIG. 5 schematically shows the microstructure from FIG. 1 with a further structure applied thereon for implementing a variant of the bonding method according to the invention in a sectional side view.
Figure 6:
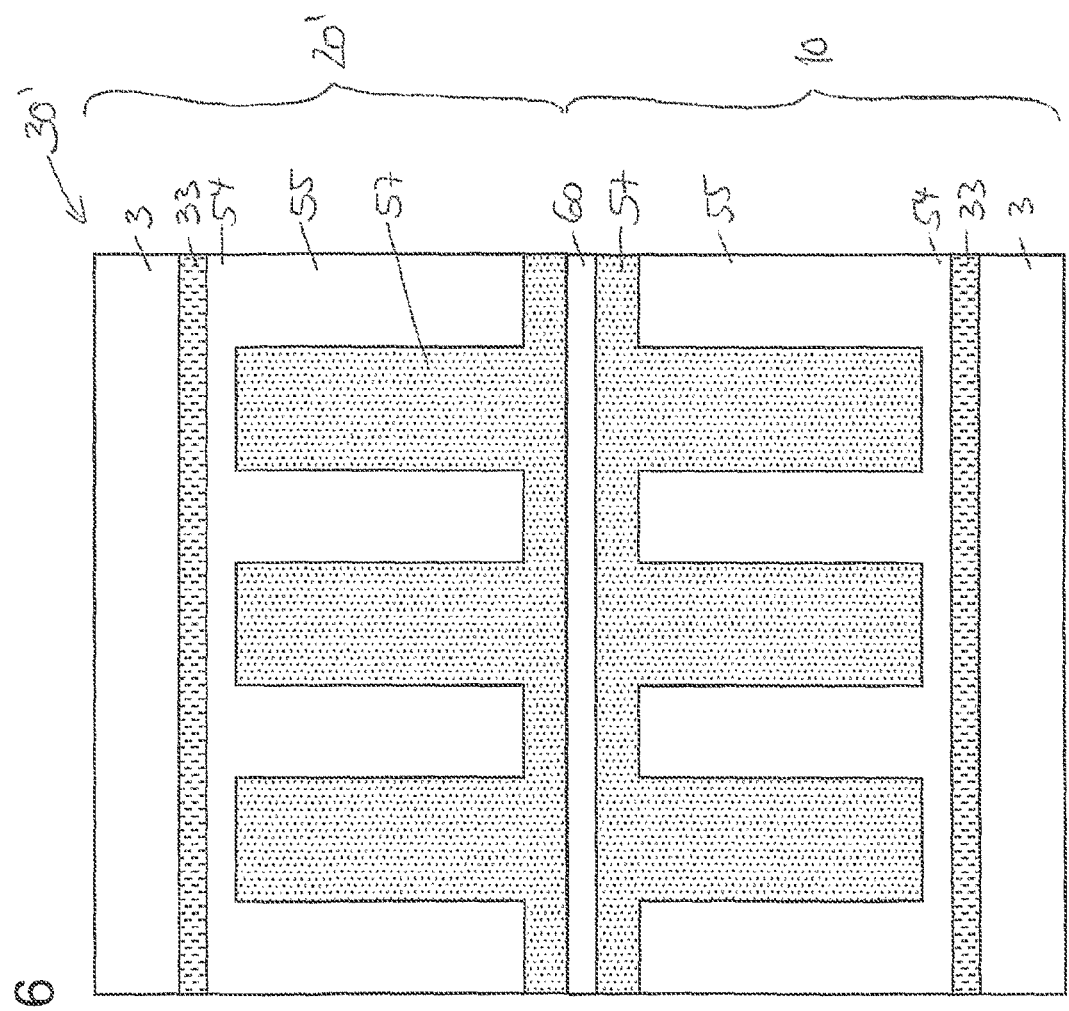
FIG. 6 schematically shows the microstructure from FIG. 1 with an identical microstructure applied thereon for implementing a further variant of the bonding method according to the invention in a sectional side view.

As a result, both the microstructure 10 shown in FIG. 1 and the microstructure 10' shown in FIG. 2 are a structure having a vertically formed reactive multilayer system, consisting of the nanostructures 55, 56 and the material 57 situated therebetween, said material constituting at least one reaction partner with respect to the material of the nanostructures 55, 56. Although FIGS. 1 and 2 in each case illustrate only one material 57 between the nanostructures 55, 56, different materials, for example at least two different materials 57, each forming a reaction partner with respect to the material of the nanostructures 55, 56, can be introduced one above another into the interspaces between the nanostructures 55, 56. The nanostructures 55, 56 can react with the material 57 situated therebetween in an exothermic reaction to form a reacted reactive multilayer system, wherein this reaction can be used, for example, in a joining method for joining the respectively illustrated microstructure 10, 10' to a further structure, as shown in FIGS. 5 and 6.

FIGS. 3a to 3d schematically show one possible process sequence of the method according to the invention for producing a microstructure 10' as illustrated in FIG. 2. For this purpose, a first process step, illustrated in FIG. 3a, involves providing a bonding substrate 1', which consists of highly doped, conductive silicon in the exemplary embodiment shown. In principle, in other embodiment variants (not shown) of the present invention, the bonding substrate 1' can also be formed from a metal.

Figure 3A:
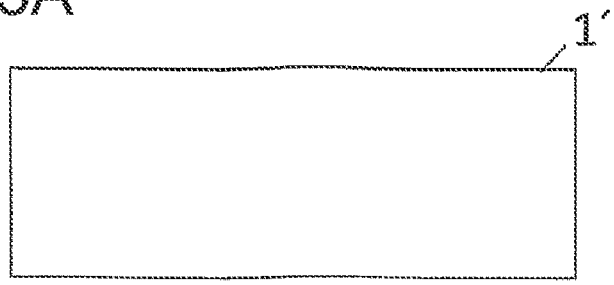
FIGS. 3a to 3d show one possible process sequence in accordance with one embodiment of the method according to the invention.
Figure 3B:
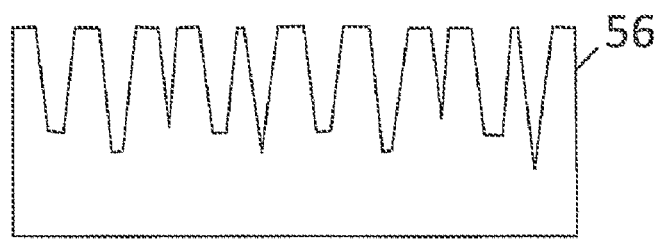

In a second process step, illustrated in FIG. 3b, the bonding substrate 1' is etched with the aid of a suitable anisotropic etching process in such a way that acicular vertical nanostructures 56 are formed at the surface of the bonding substrate 1'.

Figure 3C:
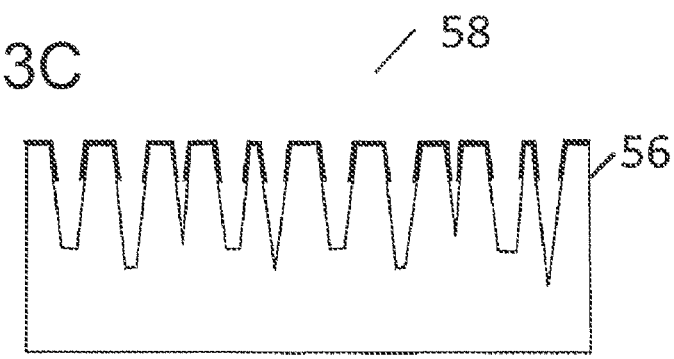

In a further process step, shown in FIG. 3c, a sputtering deposition of a metal such as aluminum or titanium is effected. Since the trenches between the vertical nanostructures 56 are significantly deeper than the horizontal distances between the vertical nanostructures 56, it is not possible to fill the trenches in their depth in the case of the sputtering process shown in FIG. 3c. Instead, the aluminum or titanium atoms deposit, in particular, as is illustrated schematically, on the tips of the acicular structures. The aluminum or titanium atoms which reach down to the bottom of the trenches between the vertical nanostructures 56 do not suffice to form a closed layer there. During the sputtering process, a layer just a few nanometers thin is deposited, which immediately oxidizes in the ambient air to form an oxide layer 58. As a result, the oxidation gives rise to a tip insulation of the vertical nanostructures 56, for example by aluminum oxide or titanium oxide.

Figure 3D:
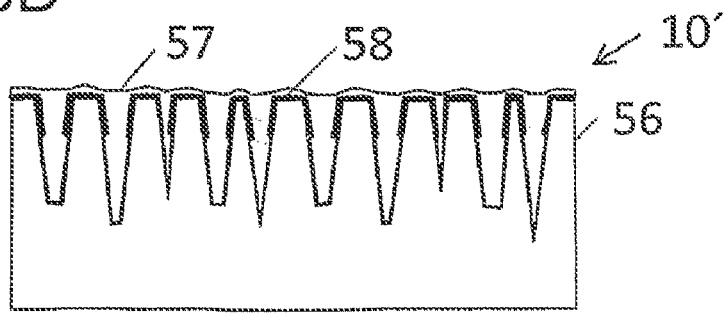

Said tip insulation is utilized in the subsequent electrolytic deposition process shown in FIG. 3d, such that the trenches between the vertical nanostructures 56 can particularly advantageously be filled electrolytically with a further material 57, such as nickel or palladium, for example, constituting a reaction partner with respect to the material of the nanostructures 56.

FIGS. 4a to 4e show a further possible embodiment variant for the embodiment of the method according to the invention for producing a microstructure, such as the microstructure 10 from FIG. 1.

Figure 4A:
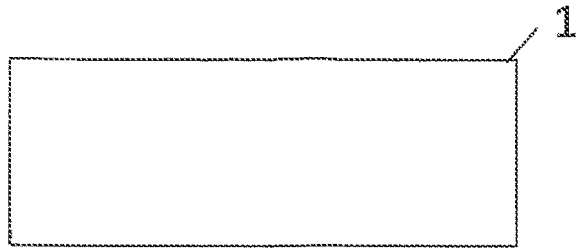
FIGS. 4a to 4e schematically show a further possible embodiment variant of the method according to the invention.

In this case, a first process step, shown in FIG. 4a, involves providing a bonding substrate 1 composed of highly doped, conductive silicon or a metal, such as palladium or platinum.

Figure 4B:
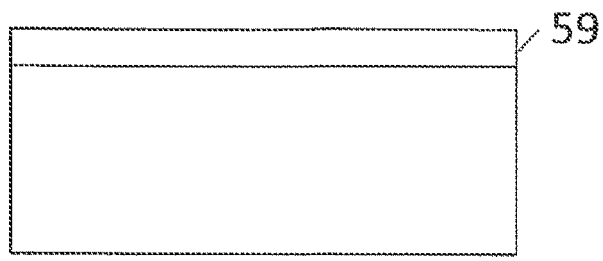

In a subsequent process step, shown in FIG. 4b, the bonding substrate 1 is coated with a photoresist material (PMMA), preferably using self-assembling polymers.

Figure 4C:
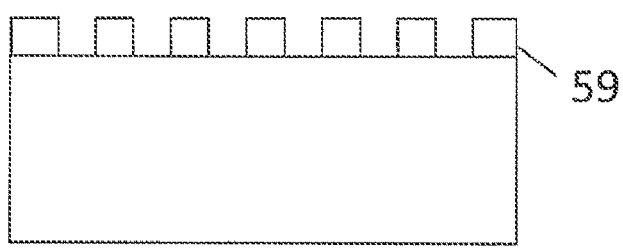

In a next method step, shown in FIG. 4c, the photoresist material is patterned to form an etching mask 59 for the vertical nanostructures 55 to be produced.

Figure 4D:
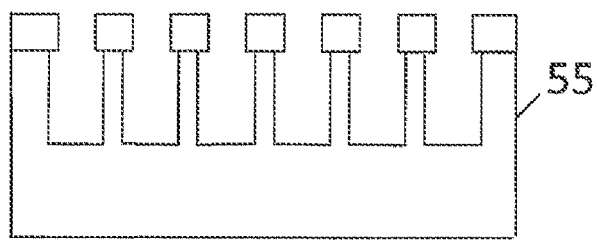

Afterward, in a method step illustrated in FIG. 4d, the bonding substrate 1 is etched into the depth via the etching mask 59. In this case, as can be seen in FIG. 4d, a certain undercut of the etching mass 59 occurs, such that care should be taken to ensure that the patterning of the etching mask 59 in the preceding step is adapted to the subsequent undercut. For the depth etching it is possible to use, for example, a so-called "Bosch process", in which narrow deep trenches can be produced by means of alternate depth etching and polymer deposition.

Figure 4E:
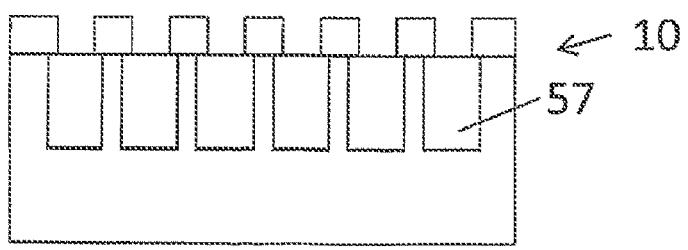

The etching mask 59 is subsequently not removed immediately, but rather serves, in the method step shown in FIG. 4e, as insulation of the tips of the produced vertical nanostructures 55 during the electrolytic deposition of a material 57, which, in the electrodeposition process, is filled into the regions situated between the nanostructures 55. In this case, the material 57 is chosen such that it can react with the material of the nanostructures 55 in an exothermic reaction. By way of example, nickel or palladium can be used as material 57.

FIG. 5 schematically shows a microsystem 30, in which, on the microstructure 10 from FIG. 1, a further structure 20 is provided, which has a substrate 2, an adhesion and/or wetting layer 81 provided thereon, and a solder or connection layer 9 provided thereon, wherein the further structure 20 is arranged on the microstructure 10 such that the solder or connection layer 9 bears on the contact layer 60. By means of suitable electrical and/or thermal contact-connection of the contact layer 60, for example by means of the bonding device 12 shown in FIG. 7, it is possible to initiate an exothermic reaction between the nanostructures 55 and the material 57 constituting a reaction partner with respect to the material of the nanostructures 55, wherein the solder or connection layer 9 melts and/or is thermally activated and the structures 10 and 20 are connected or bonded to one another as a result of the reaction.

FIG. 6 schematically shows a further possible embodiment variant of a microsystem 30' using the microstructure 10 from FIG. 1, on which a further structure 20' is arranged in the example shown, said further structure having a silicon bulk material 3, an insulator layer 33, a surface layer 54 patterned to form web-like nanostructures 55 and—situated therebetween—regions filled with a material 57 constituting a reaction partner with respect to the material of the nanostructures 55, wherein the material 57 constituting a reaction partner with respect to the material of the nanostructures 55 covers the nanostructures 55. The further structure 20' is provided on the microstructure 10 in such a way that the material 57 of the further structure 20' bears on the contact layer 60 of the microstructure 10. The structure from FIG. 6 has the special feature that here it is not absolutely necessary to provide a solder between the structures 10 and 20'.

Figure 7:
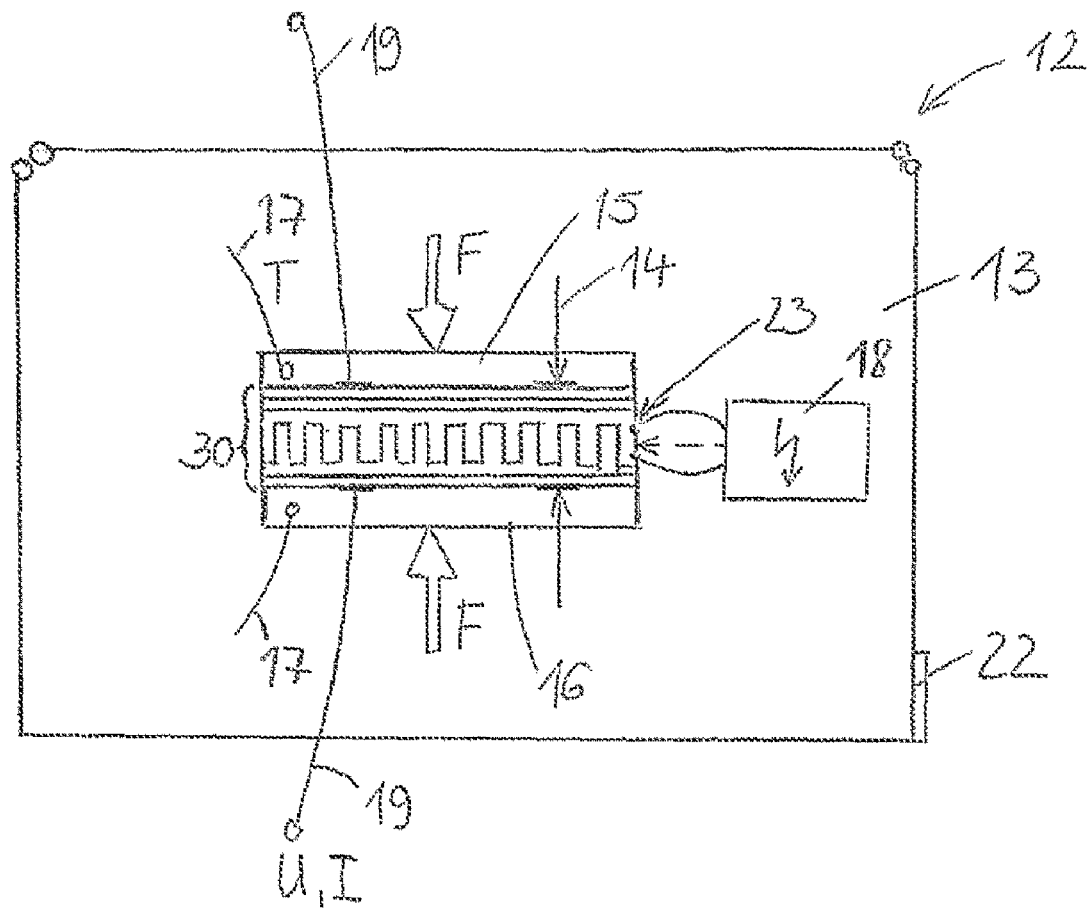
FIG. 7 schematically shows a bonding device according to the present invention in a side view.

By means of suitable electrical and/or thermal contact-connection of the contact layer 60, for example in the bonding device 12 shown in FIG. 7, it is possible to initiate an exothermic reaction between the nanostructures 55 and the material 57 of the structures 10 and 20' that is situated therebetween, as a result of which the microstructure 10 together with the further structure 20' are connected or bonded to one another as a result of this reaction.

In this case, the alignment of the microstructures 10 and 20 or 20' with respect to one another is preferably effected in the bonding device 12. Prior to alignment, it is necessary to perform, if appropriate, cleaning, surface activation and/or oxide removal on the structures to be bonded. The substrates and layers of the microsystems 30, 30' are thereupon pressed together and connected by joining according to the present invention in the bonding device 12 illustrated for example in FIG. 7.

For this purpose, by way of example, via a channel (not shown in the figures) introduced into the microstructures 10, 10', 20 and/or 20', an electrical start pulse is passed to the contact layer 60 or other contacts provided at the microstructures 10, 10', 20, 20', as a result of which the respective reactive structure is ignited. With ignition there begins an interdiffusion of adjacent atoms from the nanostructures 55, 56 and the material 57. The resultant alloy formation leads to an exothermic reaction. The heat arising in this case propagates between the nanostructures 55, 56 and the material 57 and excites further mixing of the as yet unreacted nanostructures 55, 56 and the as yet unreacted material 57, such that the bonding front can propagate over the whole area between the respective microstructures. This self-propagating reaction is characterized by an intensive local heating rate, a high propagation speed and a very short duration of the action of heat on the bonding substrates 2, 3.

After a short time, the connected substrates or microstructures can be removed from the joining device 12 and the connection can be tested. The connected substrates or the chips encapsulated by joining can thereupon be singulated and processed further.

FIG. 7 schematically shows one possible embodiment variant of a bonding device 12 according to the invention in a side view.

The bonding device 12 has a bonding chamber 13, which can be opened and closed and in which a microstructure 10, 10' and a further structure 20, 20', as described above, can be introduced and can be aligned with respect to one another by means of an alignment device 14. The microstructure 10, 10' and the further structure 20, 20' are arranged for this purpose between two pressure plates 15, 16, on which, as indicated by the arrows F, a bonding pressure having a magnitude of approximately 500 kPa to approximately 1500 kPa can be exerted.

The bonding chamber 13 is coupled to a module 22, such as a vacuum pump, by means of which the bonding chamber 13 can be evacuated or with the aid of which an excess pressure or reduced pressure can be generated in the bonding chamber 13. A normal pressure can also be set in the bonding chamber 13.

The pressure plates 15, 16 are temperature-regulated by means of connections 17, to which at least one heating device is coupled or can be coupled, wherein a temperature T in a range of approximately 20° C. to approximately 200° C. can be set in order to support the reaction. Furthermore, current and voltage connections 19 for electrical contact-connection are provided at the pressure plates 15, 16.

In the example shown, the nanostructures 55, 56 and/or the material 57 situated therebetween and/or the contact layer or structure 60 of the composite microsystem 30 to be bonded are coupled to an activation mechanism 18 integrated in the bonding chamber 13 or provided on the bonding chamber 13, by means of which activation mechanism a reaction between the nanostructures 55, 56 and the material 57 can be initiated.

In the example shown, the activation mechanism 18 has a current pulse transmitter, but in other embodiments (not shown) of the present invention can also or additionally have an oscillation pulse transmitter, a laser pulse transmitter, a heat transmitter and/or a micro-igniter. Depending on the choice of activation mechanism used, it is thus possible to provide an electrical, thermal, mechanical, optical and/or electromagnetic start pulse for the initiation of a reaction between the nanostructures 55, 56 and the material 57.

The coupling between the activation mechanism 18 and the substrates to be bonded or the layer construction provided between the substrates to be bonded is effected via contact pads, electrically conductive channels, optical windows, or the like, provided on the substrates and/or the layer construction.

By means of the activation mechanism 18, the reaction between the nanostructures 55, 56 and the material 57 is locally initiated at the start point 23 illustrated schematically in FIG. 7 and thereupon propagates independently in the microsystem 30 or the reactive vertically embodied multilayer system of another microstructure according to the invention or of a microsystem formed therewith. The reaction, gauged by a propagation speed of the reaction of 4 to 10 ms$^{-1}$, with use of 4-, 6- or 8-inch wafers, is typically already concluded after 0.01 to 0.05 seconds, plus a preparation and initiation time of approximately 1 to 15 minutes that is substantially dependent on the equipment and handleability of the bonding device 12. Furthermore, a control device can be provided on or in the bonding device 12, by means of which control device, for example, a resistance measurement on the bonded structure is possible.

The bonding device 12 is preferably embodied such that it is also suitable for bonding substrates which have at least one layer sequence composed of reactive nanolayers of different materials deposited horizontally one above another between the substrates to be bonded.

The reactive layer systems proposed according to the invention serve as an integrated energy source for the connection of semiconductor-typical components and systems, of temperature-sensitive components and of different substrates and materials such as polymers, ceramics and metals. Upon joining with these reactive structures, a self-propagating reaction takes place without further supply of energy, wherein a small heat input into the substrates to be bonded is present. The very rapid reaction propagation leads to a short process time and thus to an optimization of costs. Consequently, with the joining technology proposed according to the invention, it is possible to satisfy requirements with regard to fixed, stable and hermetically sealed connections, low bonding temperatures, for example in the range of approximately 25° C., and small heat input into surrounding material. Furthermore, in comparison with previously known bonding methods, by means of the invention, no increased costs arise, volume production is possible and it is possible to obtain a high yield in conjunction with high quality of the joining results.

One particular advantage of the present invention is the local, only brief thermal propagation only in the region of patterned frames and contacts and precisely of the order of magnitude which suffices to melt or thermally activate a solder or connection layer and to produce the connection. Further advantages are the possibility of in-situ deposition of the layers, which, as a result, can be deposited in vacuo, and in a manner free of voids and oxide, micrometer-accurate alignment of the substrates to be joined, the use of planar technologies throughout and conventional patterning techniques, the possibility of selective self-propagating bonding, the possibility of use for a wide variety of substrate and wafer sizes, and also the adjustable release of energy and quality of the connection. The small temperature fluctuations during the production of the joining connection result in an increased quality and lifetime of the connection and of the connected substrates or structures.

The present invention employing forming vertical nanostructures filled with a material constituting a reaction partner with respect to the material of the nanostructures offers great potentials in microsystems technology and sensor technology with regard to packaging or housing technology. Thus, by way of example, different substrates such as silicon in chip-to-chip, chip-to-wafer or chip-to-board technologies, ceramics, metals, plastics or combinations of the materials mentioned can be connected to one another. Consequently, the use according to the invention of reactive layer systems that are deposited or can be produced directly on a substrate to be joined for the connection of semiconductor substrates or wafers supplements the previously known bonding methods by a method without significant thermal input at the component level.

The invention claimed is:

1. A microstructure, comprising:
   at least one bonding substrate and a reactive multilayer system;
   said reactive multilayer system having at least one surface layer of said bonding substrate with vertically oriented nanostructures spaced apart from one another, and regions disposed between said nanostructures and filled with at least one material forming a reaction partner with respect to a material of said nanostructures.

2. The microstructure according to claim 1, wherein said vertical nanostructures are web-shaped nanostructures.

3. The microstructure according to claim 1, wherein said vertical nanostructures are acicular nanostructures.

4. The microstructure according to claim 1, wherein said vertical nanostructures have a structure width of approximately 10 nm to approximately 300 nm.

5. The microstructure according to claim 1, wherein said vertical nanostructures have an aspect ratio of structure width to structure depth of approximately 1:8 to approximately 1:12.

6. The microstructure according to claim 1, which comprises at least one insulator layer formed below said surface layer.

7. The microstructure according to claim 1, wherein said bonding substrate is an SOI substrate or is formed from an SOI substrate, and/or said bonding substrate is equipped with a nanoporous layer.

8. The microstructure according to claim 1, which comprises an electrical and/or thermal contact layer or structure formed on said material constituting the reaction partner with respect to the material of the nanostructures.

9. The microstructure according to claim 8, which comprises a further structure applied to said contact layer or structure, said further structure having a bonding substrate and a solder or connection layer deposited on said bonding substrate or on at least one adhesion and/or wetting layer formed on said bonding substrate, wherein said solder or connection layer of said further structure bears on said contact layer or structure of said microstructure.

10. The microstructure according to claim 8, which comprises a further structure applied to said contact layer or structure, said further structure having a bonding substrate having at least one surface layer with vertically oriented nanostructures spaced apart from one another, and wherein regions between said nanostructures are filled with at least one material constituting a reaction partner with respect to the material of said nanostructures.

11. The microstructure according to claim 1, which comprises at least one layer selected from the group consisting of an adhesion layer and a wetting layer deposited on the material constituting the reaction partner with respect to the material of said nanostructures.

12. The microstructure according to claim 9, which comprises at least one electrical contact structure contact-connecting the material constituting the reaction partner with respect to the material of said nanostructures, wherein said at least one contact structure is connected to an electrically conductive channel leading at least through said bonding substrate of the microstructure and/or said bonding substrate of said further structure.

13. The microstructure according to claim 12, wherein said at least one electrical contact structure and said electrically conductive channel are formed of copper.

14. A method of producing a microstructure having at least one bonding substrate and a reactive multilayer system, the method which comprises:
   for forming the reactive multilayer system, patterning at least one surface layer of the bonding substrate or depositing the at least one surface layer in patterned fashion to form vertically oriented nanostructures spaced apart from one another; and
   filling regions between the nanostructures with at least one material constituting a reaction partner with respect to the material of the nanostructures.

15. The method according to claim 14, which comprises using as a bonding substrate an SOI substrate or a prepatterned SOI substrate and/or a substrate with a nanoporous layer.

16. The method according to claim 14, which comprises depositing at least one layer selected from the group consisting of an adhesion layer and a wetting layer on the material constituting the reaction partner with respect to the material of the nanostructures.

17. The method according to claim 14, which comprises depositing an electrical and/or thermal contact layer or structure on the material constituting the reaction partner with respect to the material of the nanostructures.

18. The method according to claim 14, which comprises electrolytically depositing the material of the microstructure constituting the reaction partner with respect to the material of the nanostructures.

19. The method according to claim 18, which comprises depositing the material constituting the reaction partner with respect to the material of the nanostructures in a pulse plating process.

20. The method according to claim 14, which comprises controlling a process temperature during the step of depositing the material constituting the reaction partner with respect to the material of the nanostructures.

21. The method according to claim 14, which comprises applying a further structure having a bonding substrate, a solder or connection layer deposited on the bonding substrate or deposited on an adhesion and/or wetting layer provided on the bonding substrate by way of the solder or connection layer to the material of the microstructure constituting the reaction partner with respect to the material of the nanostructures.

22. The method according to claim 17, which comprises applying a further structure, having a bonding substrate with at least one surface layer with vertically oriented nanostructures spaced apart from one another, wherein regions between the nanostructures are filled with at least one material constituting a reaction partner with respect to the material of the nanostructures, to the contact layer or structure of the microstructure by way of the material constituting the reaction partner with respect to the material of the nanostructures.

23. The method according to claim 21, which comprises patterning the bonding substrate of the microstructure and/or the bonding substrate of the further structure and/or a solder or connection layer of the microstructure and/or the solder or connection layer of the further structure by a process selected from an etching process, a lift-off process, a resist mask process, a shadow mask process, a photoresist process, a sacrificial layer process and a lithography process, and wherein the patterning is effected below an activation temperature of the nanostructures and of the material constituting a reaction partner with respect to the material of the nanostructures.

24. The method according to claim 21, which comprises forming at least one electrical contact or an electrical contact layer adjoining at least one of the nanostructures and/or the material constituting the reaction partner with respect to the material of the nanostructures, and/or forming at least one electrically conductive channel for contacting the at least one contact or the electrical contact layer which is led at least through the bonding substrate of the microstructure and/or the bonding substrate of the further structure.

25. The method according to claim 21, which comprises bonding the microstructure to the further structure by aligning same with one another and pressing onto one another under a vacuum with a pressure of approximately 500 kPa to approximately 1500 kPa, and setting a temperature in a range of approximately 20° C. to approximately 200° C.

26. A microsystem, comprising:
two bonding substrates and a construction between said bonding substrates, said construction having a reacted reactive layer system;
said reacted reactive layer system being a reacted structure sequence composed of at least one surface layer, provided on at least one of the bonding substrates, with vertically oriented nanostructures spaced apart from one another, and regions filled between the nanostructures with at least one material constituting a reaction partner with respect to a material of the nanostructures;
the microsystem being a sensor coated with biomaterial and/or having elements of polymeric material and/or at least one component selected from the group consisting of a magnetic component, a piezoelectric component, and a piezoresistive component.

* * * * *